US012710494B2

(12) United States Patent
Sato et al.

(10) Patent No.: US 12,710,494 B2
(45) Date of Patent: Aug. 18, 2026

(54) MAGNETIC RESONANCE IMAGING APPARATUS

(71) Applicant: FUJIFILM Corporation, Tokyo (JP)

(72) Inventors: Eiji Sato, Chiba (JP); Masayoshi Dohata, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 105 days.

(21) Appl. No.: 18/797,520

(22) Filed: Aug. 8, 2024

(65) Prior Publication Data

US 2025/0052841 A1 Feb. 13, 2025

(30) Foreign Application Priority Data

Aug. 9, 2023 (JP) ................................ 2023-130083

(51) Int. Cl.
*G01R 33/36* (2006.01)

(52) U.S. Cl.
CPC ..... *G01R 33/3657* (2013.01); *G01R 33/3628* (2013.01)

(58) Field of Classification Search
CPC ........................ G01R 33/3628; G01R 33/3657
See application file for complete search history.

(56) References Cited

U.S. PATENT DOCUMENTS

| | | | | |
|---|---|---|---|---|
| 7,639,008 | B2 * | 12/2009 | Ookawa | G01R 33/3415 324/307 |
| 10,247,793 | B2 | 4/2019 | Duensing et al. | |
| 11,041,930 | B2 * | 6/2021 | Mitsui | G01R 33/583 |
| 11,269,038 | B2 * | 3/2022 | Cheng | G01R 33/583 |

FOREIGN PATENT DOCUMENTS

| | | |
|---|---|---|
| JP | 2008068008 | 3/2008 |
| JP | 2017509413 | 4/2017 |

* cited by examiner

*Primary Examiner* — Gregory H Curran
(74) *Attorney, Agent, or Firm* — JCIPRNET

(57) ABSTRACT

A magnetic resonance imaging apparatus includes decoupling circuits respectively connected to receive coils, the decoupling circuits including a first FET and a second FET as changeover switches for switching each of the receive coils between a resonance state and a detuning state, and an FET switch controller that applies a drive voltage to gates of the first and second FETs and performs ON/OFF control. The magnetic resonance imaging apparatus includes a first detection circuit and a second detection circuit for causing a current to the first and second FETs from a reference voltage source, respectively, detects whether the current has flowed to the first FET and/or the second FET via the first detection circuit and/or the second detection circuit, and determines normality or abnormality of the first FET and/or the second FET based on a detection result and a state of a drive voltage applied to the gates.

14 Claims, 12 Drawing Sheets

Figure 2:
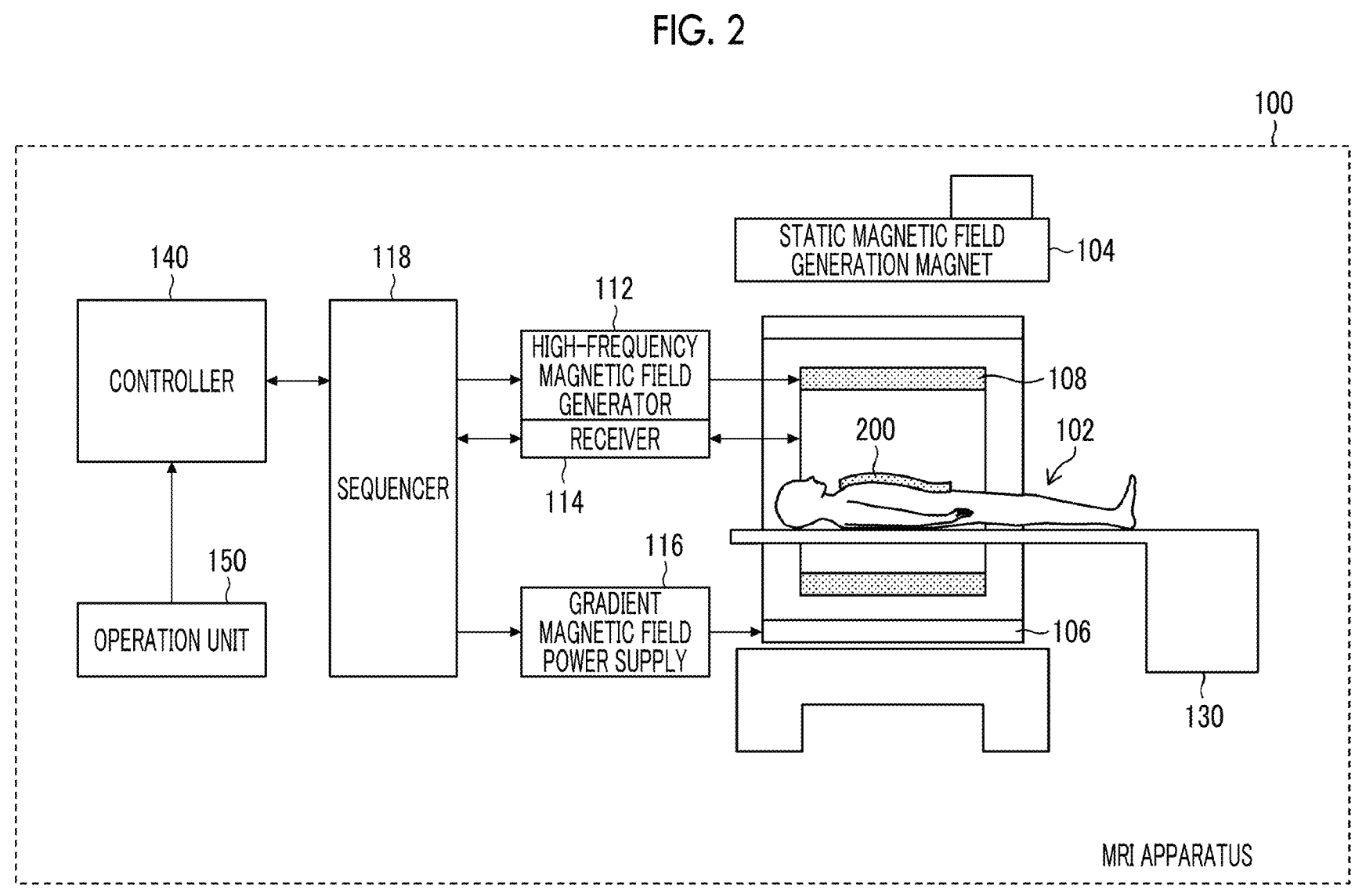

MRI APPARATUS

104 STATIC MAGNETIC FIELD GENERATION MAGNET

108

102

106

130

200

112 HIGH-FREQUENCY MAGNETIC FIELD GENERATOR

114 RECEIVER

116 GRADIENT MAGNETIC FIELD POWER SUPPLY

118 SEQUENCER

140 CONTROLLER

150 OPERATION UNIT

FIG. 4

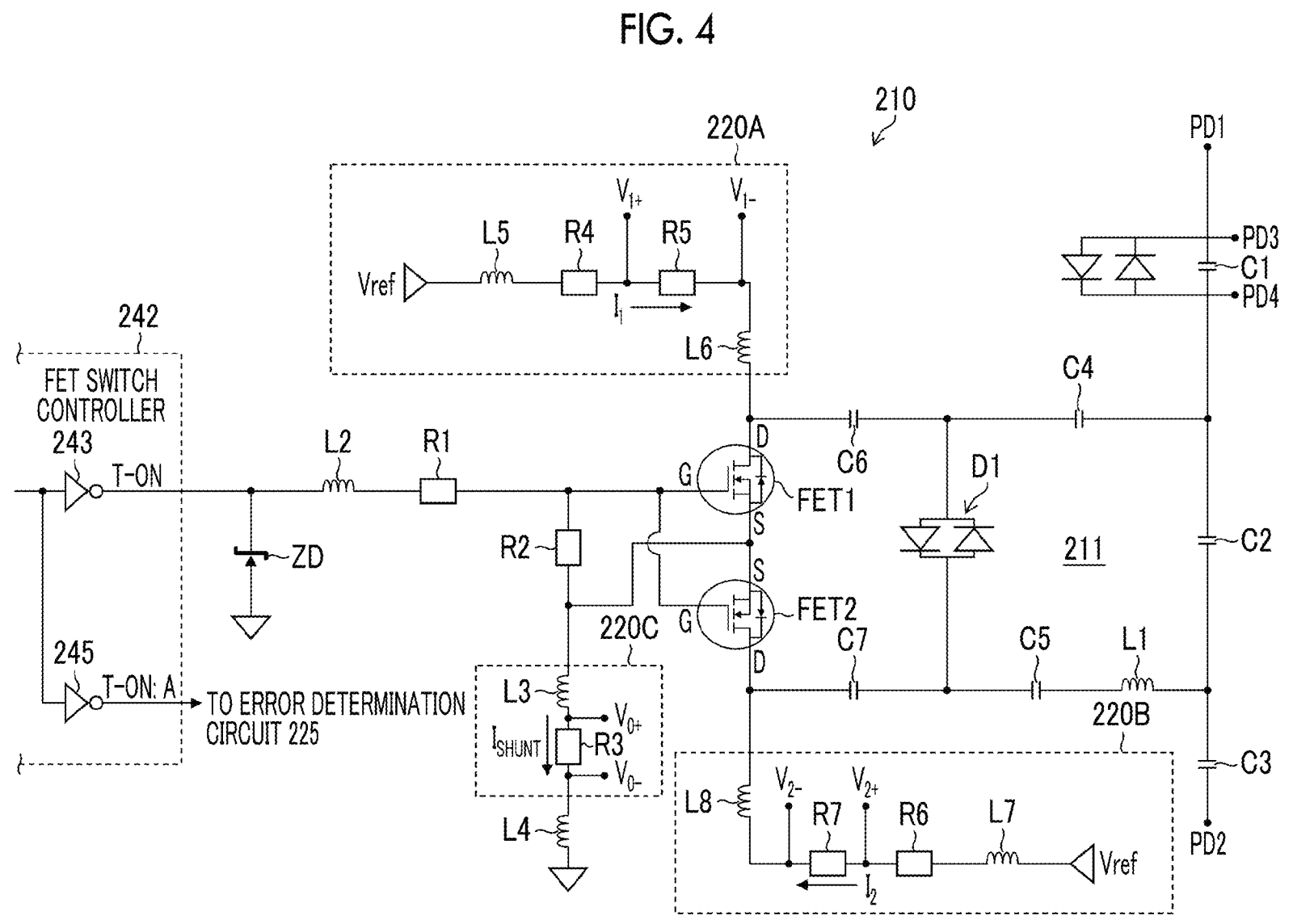

210
PD1
PD3
C1
PD4
C2
C3
PD2
C4
211
L1
220B
C5
Vref
L7
D1
R6
C6
C7
V2+
I2
FET1
FET2
R7
V2-
220A
V1-
D
S
S
D
L6
G
G
L8
R5
V1+
I1
220C
V0+
R3
V0-
R4
R2
L3
ISHUNT
L4
L5
R1
Vref
L2
ZD
TO ERROR DETERMINATION CIRCUIT 225
242
FET SWITCH CONTROLLER
T-ON
T-ON: A
243
245

FIG. 6

| A<br>FET CONTROL SIGNAL<br>ON: 1, OFF: 0 | B<br>CURRENT $I_1$<br>DETECTION RESULT<br>DETECTION: 1,<br>NON-DETECTION: 0 | C<br>CURRENT $I_2$<br>DETECTION RESULT<br>DETECTION: 1,<br>NON-DETECTION: 0 | D<br>ERROR<br>DETERMINATION<br>Error: 1, Normal: 0 | REMARKS<br>CORRESPONDING No. STATE |
|---|---|---|---|---|
| 0 | 0 | 0 | 0 | Normal (OFF) |
| 0 | 0 | 1 | 1 | Error: Short BETWEEN D-S OF FET 2 SIDE |
| 0 | 1 | 0 | 1 | Error: Short BETWEEN D-S OF FET 1 SIDE |
| 0 | 1 | 1 | 1 | Error: Short BETWEEN D-S OF BOTH FET 1 AND FET 2 |
| 1 | 0 | 0 | 1 | Error: Open BETWEEN D-S OF BOTH FET 1 AND FET 2 (FET: OFF)<br>Error: Short BETWEEN G-S OF BOTH FET 1 AND FET 2 (FET: OFF) |
| 1 | 0 | 1 | 1 | Error: Open BETWEEN D-S OF FET 2 SIDE (FET: OFF)<br>Error: Short BETWEEN G-S OF FET 2 SIDE (FET: OFF) |
| 1 | 1 | 0 | 1 | Error: Open BETWEEN D-S OF FET 1 SIDE (FET: OFF)<br>Error: Short BETWEEN G-S OF FET 1 SIDE (FET: OFF) |
| 1 | 1 | 1 | 0 | Normal (ON) |

(A) T-ON SIGNAL A
(B) DETECTION SIGNAL B OF COMPARATOR 223
(C) DETECTION SIGNAL C OF COMPARATOR 224
(D) ERROR DETECTION SIGNAL D
H
L
H
L
H
L
H
L 200-1
200-2
200-n
232-1
232-2
232-n
210-1
210-2
210-n
240
FET SWITCH CONTROLLER
DETERMINATION RECEPTION UNIT
DETUNING FUNCTION CONTROLLER
242
244
118
SEQUENCER

118
SEQUENCER
242
244
240
FET SWITCH CONTROLLER
DETERMINATION RECEPTION UNIT
DETUNING FUNCTION CONTROLLER
200-1
210-1a
210-1b
233-1a
233-1b
200-2
210-2a
210-2b
233-2a
233-2b
200-n
210-na
210-nb
233-na
233-nb

FIG. 12
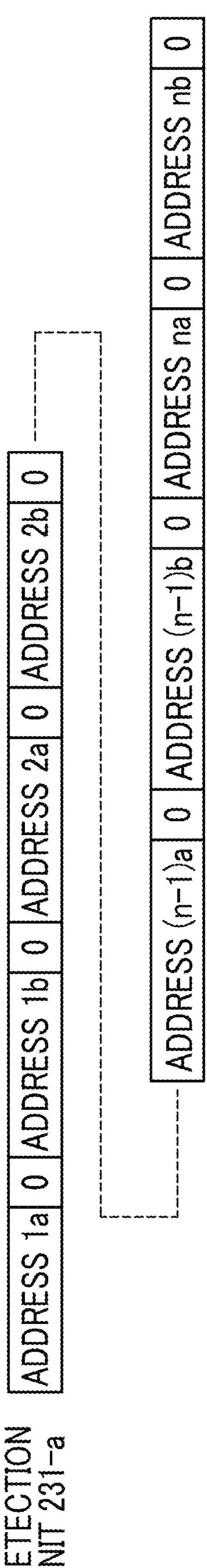

MAGNETIC RESONANCE IMAGING APPARATUS

CROSS-REFERENCE TO RELATED APPLICATION

The present application claims priority under 35 U.S.C § 119(a) to Japanese Patent Application No. 2023-130083 filed on Aug. 9, 2023, which is hereby expressly incorporated by reference, in its entirety, into the present application.

BACKGROUND OF THE INVENTION

1. Field of the Invention

The present invention relates to a magnetic resonance imaging apparatus, and more particularly to a decoupling circuit that switches a receive coil between a resonance state and a detuning state.

2. Description of the Related Art

In the related art, a decoupling circuit using a PIN diode driven by a current as a changeover switch has been proposed (JP2008-68008A).

However, the decoupling circuit using the PIN diode has a problem that a required power increases with the recent multi-channelization of the receive coil.

On the other hand, JP2017-509413A proposes a decoupling circuit (also referred to as a detuning circuit) using a field effect transistor (FET) driven by a voltage as a low-loss switch.

SUMMARY OF THE INVENTION

Though the decoupling circuit disclosed in JP2017-509413A can reduce power consumption by using the FET driven by the voltage, it does not consider measures in a case in which a failure, such as disconnection or short-circuit, occurs in the FET.

The present invention has been made in view of such circumstances, and an object of the present invention is to provide a magnetic resonance imaging apparatus that can reduce power consumption of driving of a decoupling circuit and detect a failure.

A first aspect of the present invention relates to a magnetic resonance imaging apparatus comprising: a plurality of receive coils that have a plurality of coils, that are adjusted to resonate at a specific frequency, and that receive a nuclear magnetic resonance signal from a subject; a plurality of decoupling circuits that are respectively connected to the plurality of receive coils and that each include a field effect transistor, the plurality of decoupling circuits switching each of the receive coils between a resonance state and a detuning state according to a drive voltage applied to a gate of the field effect transistor; a controller that controls the drive voltage applied to the gate of the field effect transistor of each of the plurality of decoupling circuits; a detection unit that includes a detection circuit for causing a current to flow from a reference voltage source to the field effect transistor and that detects whether the current has flowed to the field effect transistor via the detection circuit; and a determination unit that determines normality or abnormality of the field effect transistor based on a state of the drive voltage applied to the gate of the field effect transistor and a detection result of the detection unit.

According to the first aspect of the present invention, since the field effect transistor that is turned ON/OFF by the drive voltage applied to the gate is used as the changeover switch of the decoupling circuit, it is possible to reduce power consumption of driving of the decoupling circuit. In addition, the detection circuit for causing the current to the field effect transistor from the reference voltage source can be provided, whether the current has flowed to the field effect transistor can be detected via the detection circuit, and normality or abnormality of the field effect transistor can be determined based on the detection result and the state of the drive voltage applied to the gate of the field effect transistor. That is, a failure such as disconnection or short-circuit related to the field effect transistor can be appropriately determined.

In a second aspect of the present invention, in the magnetic resonance imaging apparatus according to the first aspect, it is preferable that the detection circuit includes a resistor for current detection, and the detection unit detects whether the current has flowed to the field effect transistor based on a potential difference between both ends of the resistor.

In a third aspect of the present invention, in the magnetic resonance imaging apparatus according to the second aspect, it is preferable that the detection circuit includes an inductor.

In a fourth aspect of the present invention, in the magnetic resonance imaging apparatus according to any one of the first to third aspects, it is preferable that one end of the detection circuit is connected to the reference voltage source, and the other end of the detection circuit is connected to a drain of the field effect transistor.

In a fifth aspect of the present invention, in the magnetic resonance imaging apparatus according to any one of the first to fourth aspects, it is preferable that the detection circuit is provided between a source of the field effect transistor and a ground.

In a sixth aspect of the present invention, in the magnetic resonance imaging apparatus according to any one of the first to fifth aspects, it is preferable that the field effect transistor of the decoupling circuit consists of a first field effect transistor and a second field effect transistor each having a source connected, and the detection unit consists of a first detection unit that includes a first detection circuit for causing the current to flow from the reference voltage source to the first field effect transistor and that detects whether the current has flowed to the first field effect transistor via the first detection circuit, and a second detection unit that includes a second detection circuit for causing the current to flow from the reference voltage source to the second field effect transistor and that detects whether the current has flowed to the second field effect transistor via the second detection circuit.

In a seventh aspect of the present invention, in the magnetic resonance imaging apparatus according to the sixth aspect, it is preferable that the determination unit determines normality or abnormality of at least one of the first field effect transistor or the second field effect transistor based on a state of the drive voltage applied to a gate of the first field effect transistor and a gate of the second field effect transistor, a detection result of the first detection unit, and a detection result of the second detection unit.

In an eighth aspect of the present invention, in the magnetic resonance imaging apparatus according to any one of the first to seventh aspects, it is preferable that, in a case in which the drive voltage is changed to switch the field effect transistor from an OFF state to an ON state and to switch the field effect transistor from the ON state to the OFF state, the determination unit stops the determination of the normality or the abnormality of the field effect transistor for a certain period from at least a change time point of the drive voltage. This is for preventing erroneous determination due to a time lag between a timing at which the drive voltage is changed and a timing at which the detection result of the detection unit is changed.

In a ninth aspect of the present invention, in the magnetic resonance imaging apparatus according to any one of the first to eighth aspects, it is preferable that a Zener diode is provided on a gate side of the field effect transistor, to prevent an abnormal voltage from being applied to the gate of the field effect transistor. This is for preventing the failure of the field effect transistor (failure due to application of the abnormal voltage to the gate).

In a tenth aspect of the present invention, it is preferable that the magnetic resonance imaging apparatus according to any one of the first to ninth aspects, further comprises: a determination reception unit that receives a determination result of the determination unit provided corresponding to each of the plurality of decoupling circuits, in which the determination reception unit is connected parallel to a plurality of the determination units and acquires the determination result from each of the plurality of determination units. As a result, the determination result indicating the presence or absence of such a failure of the field effect transistor can be acquired for each of the decoupling circuits corresponding to the receive coils of the multi-channels, and in a case in which the field effect transistor has failed, a failure location can be specified.

In an eleventh aspect of the present invention, in the magnetic resonance imaging apparatus according to the tenth aspect, it is preferable that the determination reception unit adds a unique address for each determination unit to each of a plurality of the received determination results.

In a twelfth aspect of the present invention, in the magnetic resonance imaging apparatus according to the tenth aspect, it is preferable that each of the plurality of determination units has a unique address for each determination unit, and transmits the determination result and the address to the determination reception unit in association with each other.

In a thirteenth aspect of the present invention, it is preferable that the magnetic resonance imaging apparatus according to any one of the first to ninth aspects, further comprises: a determination reception unit that receives the determination results from a plurality of the determination units provided corresponding to the plurality of decoupling circuits, respectively, in which the plurality of determination units are connected in series to each other, and in a case in which the plurality of determination units are denoted by 1 to n and a lastly connected determination unit is defined as an n-th determination unit, the n-th determination unit transmits its own determination result to an (n−1)-th determination unit, the (n−1)-th determination unit concatenates the received determination result of the n-th determination unit with its own determination result and transmits the concatenated determination result to an (n−2)-th determination unit, this process is repeated, and as a result, a first determination unit transmits the determination result in which the determination results of the plurality of determination units are sequentially concatenated to the determination reception unit. As a result, the number of signal cables for returning the determination result of each determination unit to the determination reception unit can be reduced.

In a fourteenth aspect of the present invention, in the magnetic resonance imaging apparatus according to the thirteenth aspect, it is preferable that each of the plurality of determination units has a unique address for each determination unit, and concatenates the determination result along with its own address in a case of concatenating the determination result.

According to the aspects of the present invention, since the field effect transistor that is turned ON/OFF by the drive voltage applied to the gate is used as the changeover switch of the decoupling circuit, it is possible to reduce power consumption of driving of the decoupling circuit. Further, since the detection circuit for causing the current to the field effect transistor from the reference voltage source is provided, normality or abnormality of the field effect transistor can be determined, and the failure such as disconnection or short-circuit related to the field effect transistor can be appropriately determined.

BRIEF DESCRIPTION OF THE DRAWINGS

FIG. 2 is a diagram illustrating a schematic configuration of an inside of the MRI apparatus illustrated in FIG. 1.

FIG. 4 is a circuit diagram illustrating an embodiment of a decoupling circuit according to the embodiment of the present invention.

FIG. 6 is a truth value table illustrating a relationship among a T-ON signal A, a detection signal B of a current $I_1$, a detection signal C of a current $I_2$, and an error detection signal D output from the error determination circuit.

Figure 5:
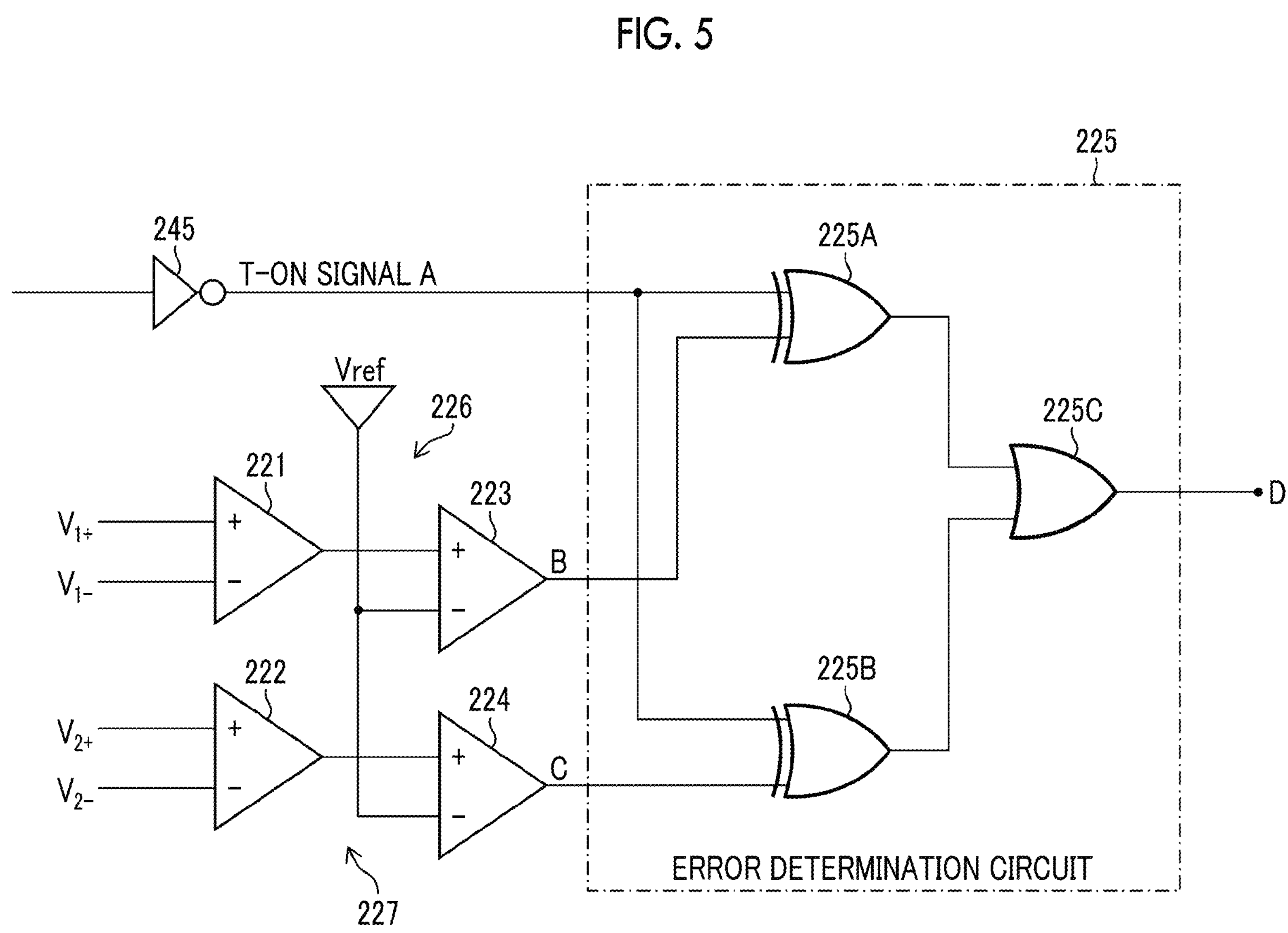
FIG. 5 is a diagram illustrating an embodiment of a detection unit and a determination unit (error determination circuit) provided for each decoupling circuit.
Figure 7:
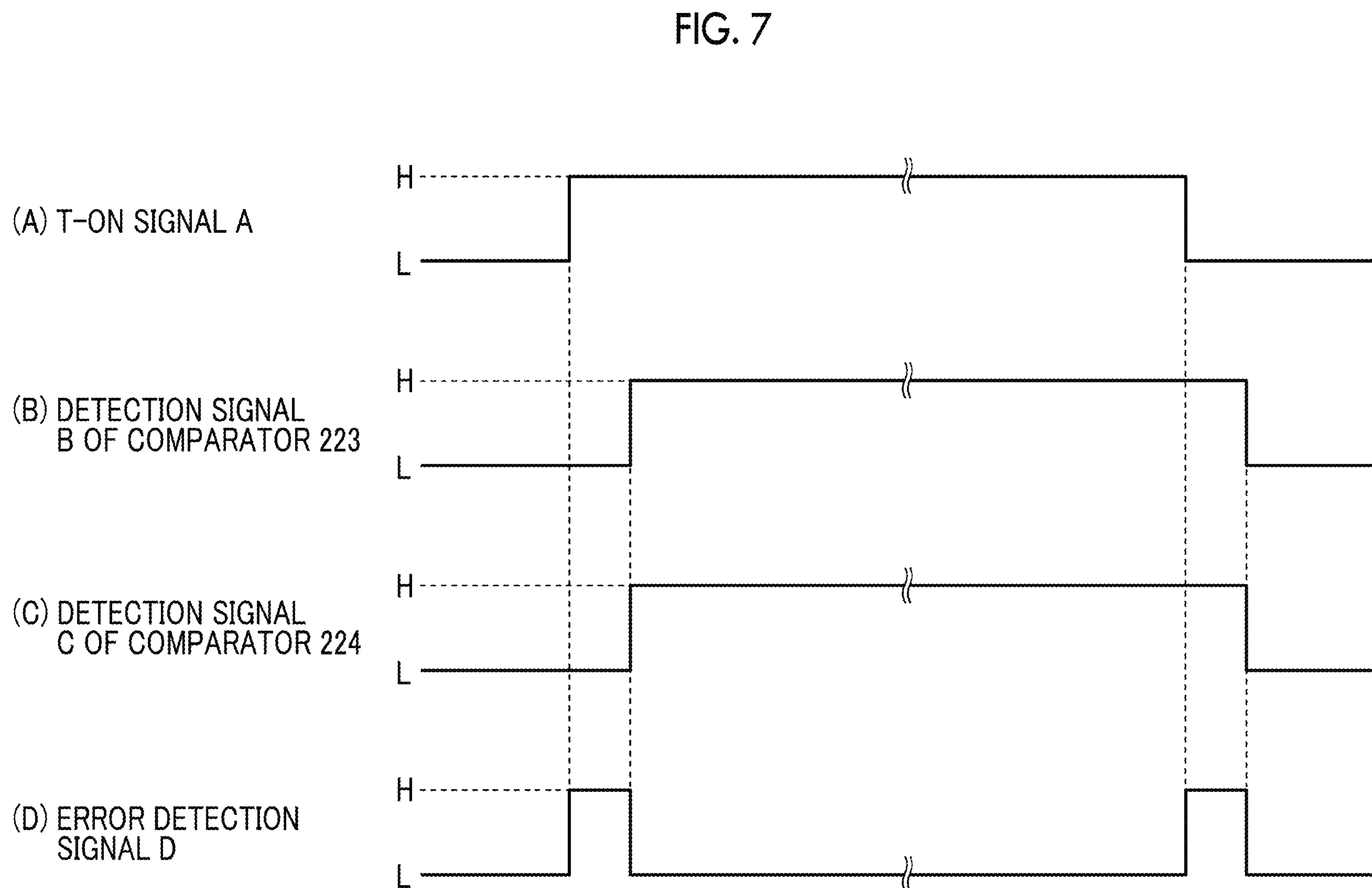

(A) to (D) of FIG. 7 are timing charts illustrating the T-ON signal A, the detection signals B and C, and the error detection signal D illustrated in FIG. 5, respectively.

Figure 8:
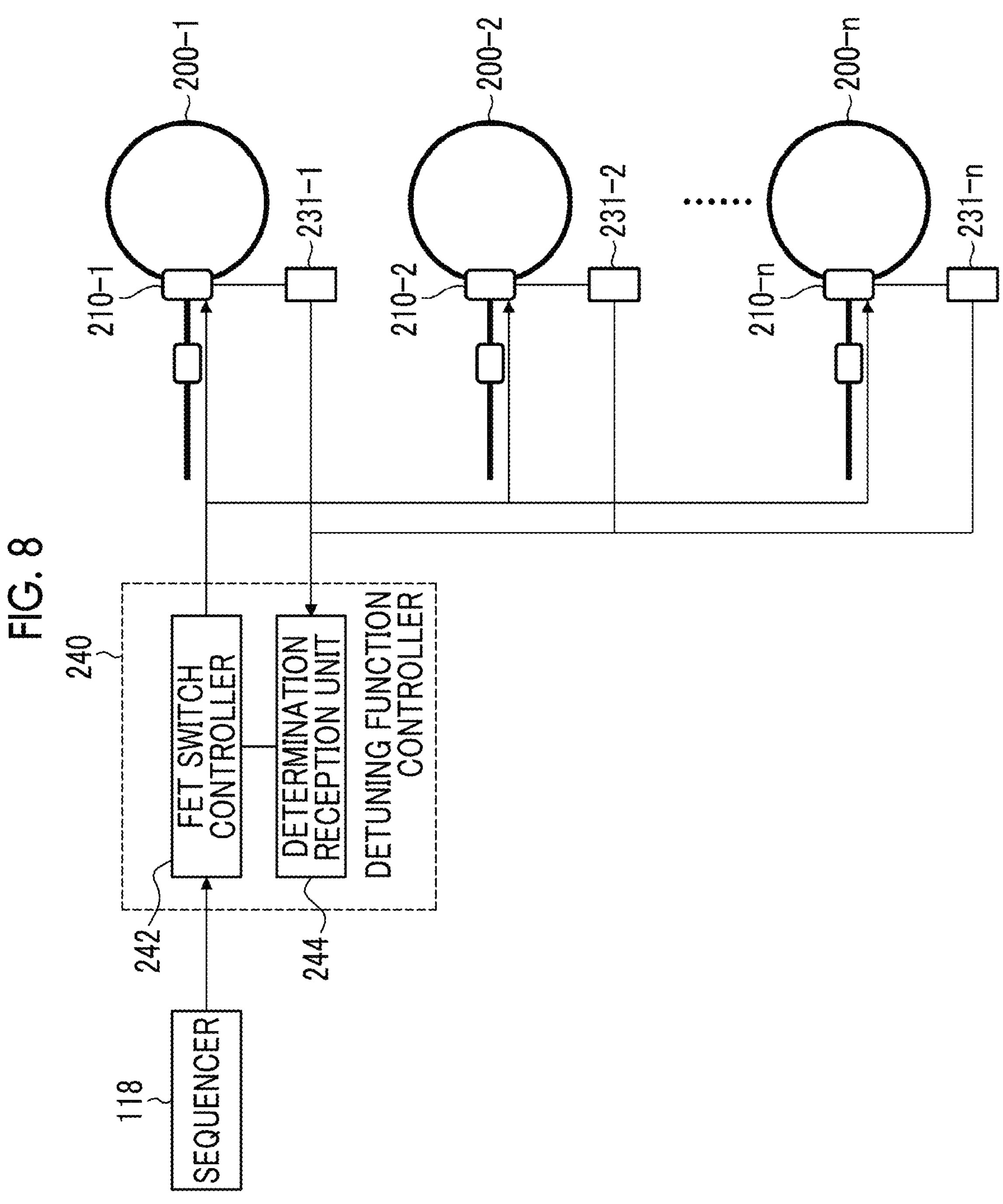

FIG. 8 is a block diagram illustrating a first embodiment of a transmission/reception unit for an error determination result.

Figure 9:
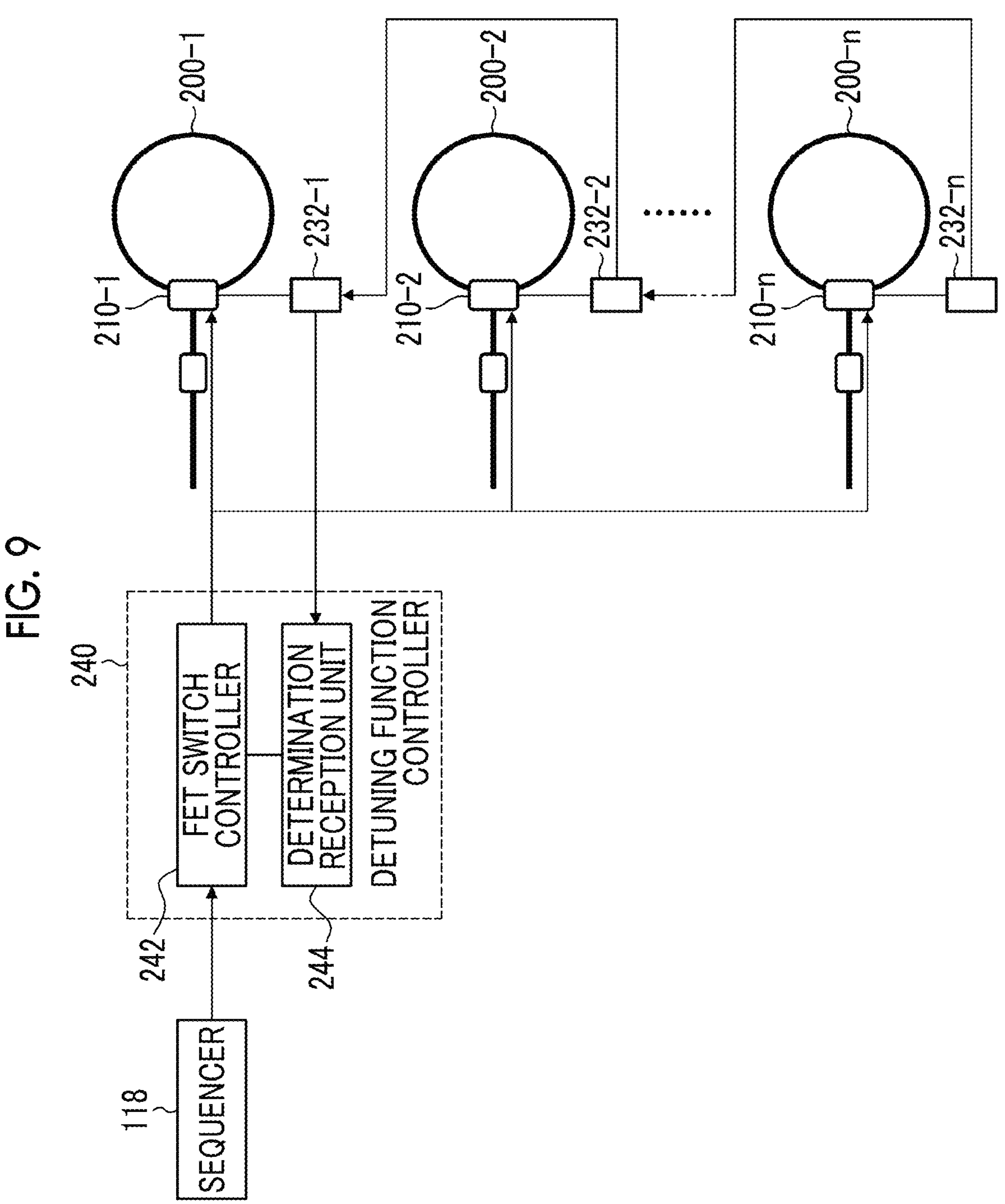

FIG. 9 is a block diagram illustrating a second embodiment of the transmission/reception unit for the error determination result.

Figure 10:
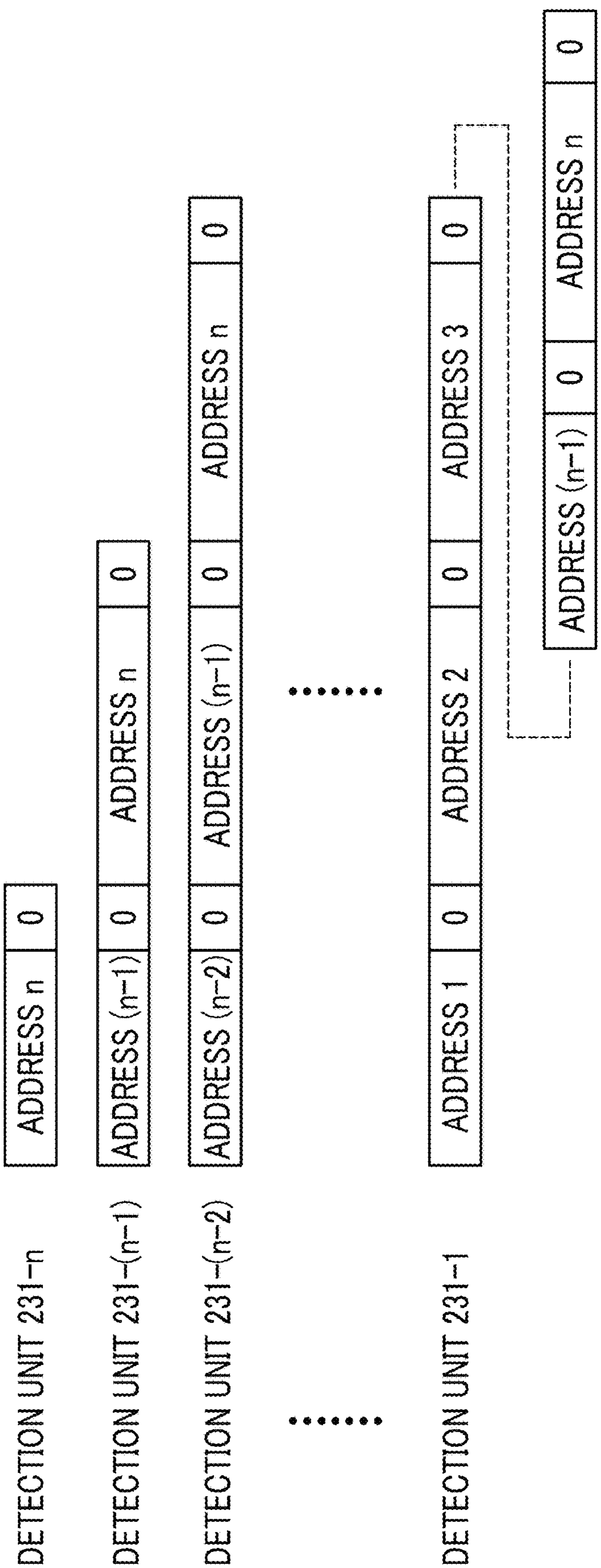

FIG. 10 is a diagram illustrating an example of transmission data such as a determination result transmitted from each determination unit illustrated in FIG. 9.

Figure 11:
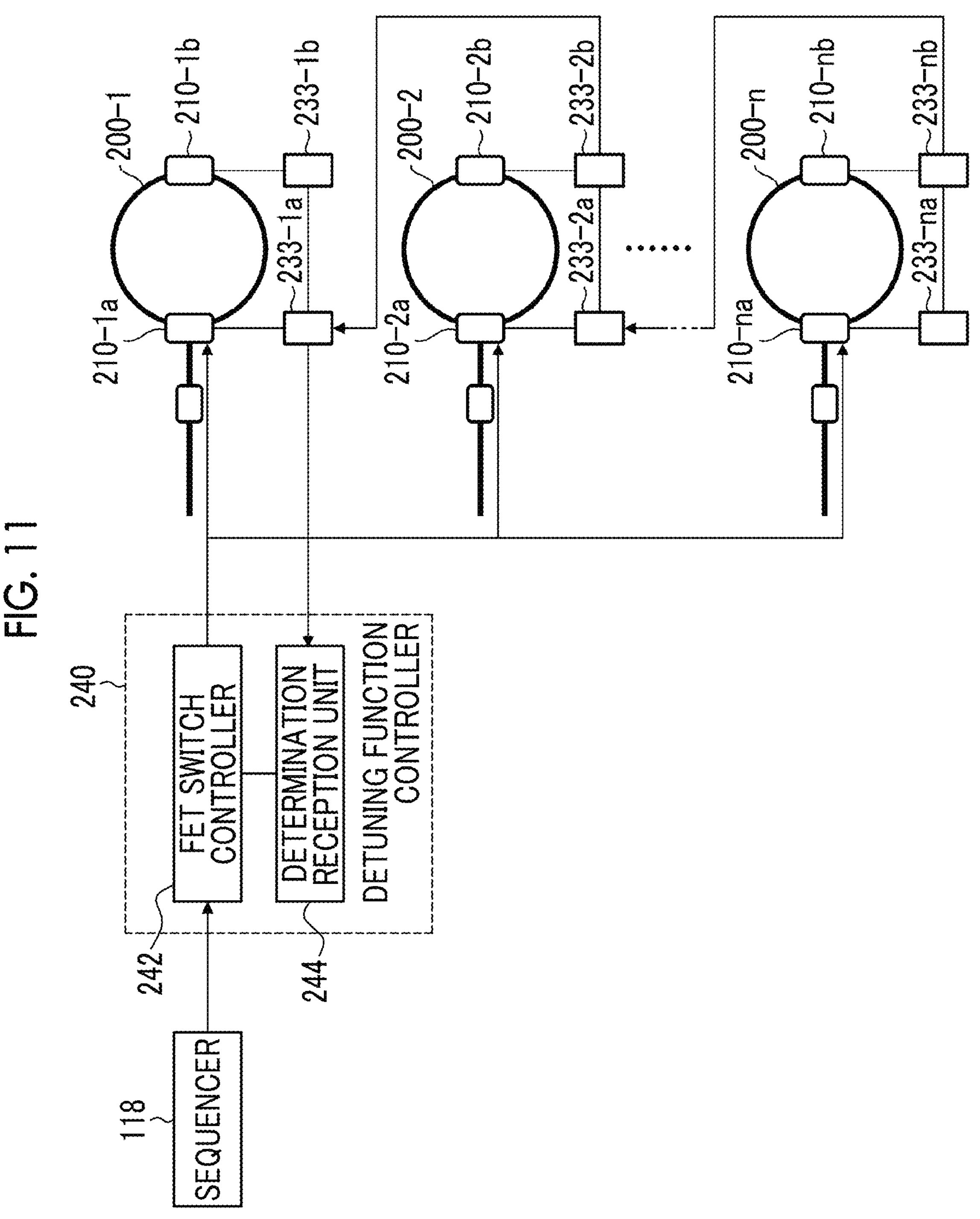

FIG. 11 is a block diagram illustrating a third embodiment of the transmission/reception unit for the error determination result.

FIG. 12 is a diagram illustrating an example of the transmission data of the determination result transmitted from the determination unit connected to a determination reception unit to the determination reception unit.

DESCRIPTION OF THE PREFERRED EMBODIMENTS

Hereinafter, preferred embodiments of a magnetic resonance imaging apparatus according to an embodiment of the present invention will be described with reference to the accompanying drawings.

Appearance of MRI Apparatus

Figure 1:
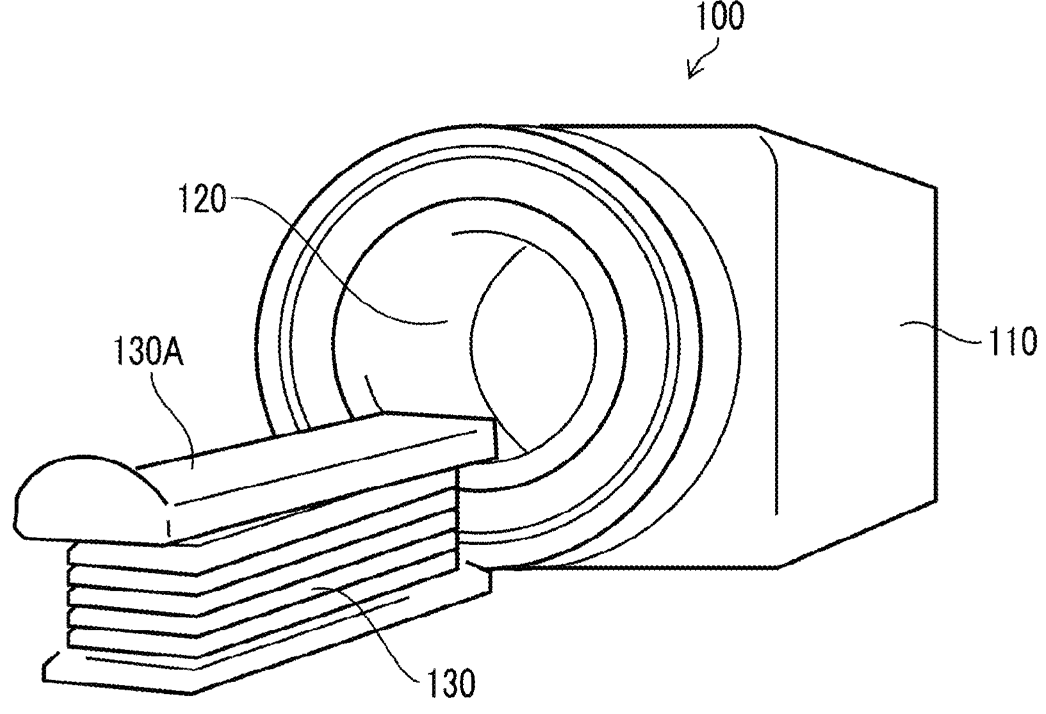
FIG. 1 is a perspective view illustrating an appearance of a magnetic resonance imaging apparatus (MRI apparatus) according to an embodiment of the present invention.

FIG. 1 is a perspective view illustrating an appearance of a magnetic resonance imaging apparatus according to the embodiment of the present invention.

A magnetic resonance imaging apparatus (magnetic resonance imaging (MRI) apparatus) 100 illustrated in FIG. 1 comprises a gantry 110 and an examination table 130 comprising a top plate 130A disposed on a front side of a bore 120 which is a cylindrical imaging space provided in the gantry 110.

Internal Configuration of MRI Apparatus

FIG. 2 is a diagram illustrating a schematic configuration of an inside of the MRI apparatus illustrated in FIG. 1.

As illustrated in FIG. 2, the MRI apparatus 100 comprises a static magnetic field generation magnet 104 that generates a uniform static magnetic field in the imaging space in which a subject 102 is disposed, a gradient magnetic field coil 106 that generates a gradient magnetic field in the imaging space, a radio frequency (RF) coil (transmission coil) 108 that generates a high-frequency magnetic field that generates a nuclear magnetic resonance signal (NMR signal) in an atomic nucleus of an atom constituting a tissue of the subject 102, and a receive coil device 200 that detects the NMR signal generated from the subject 102.

As illustrated in FIGS. 1 and 2, the subject 102 lying on the top plate 130A of the examination table 130 in a supine position is moved to locate an examination part of the subject 102 at the center of the static magnetic field in the bore 120 by moving the top plate 130A to the bore 120.

A sequencer 118 transmits commands to a high-frequency magnetic field generator 112 and a gradient magnetic field power supply 116 in accordance with an imaging sequence (pulse sequence), to generate the high-frequency magnetic field and the gradient magnetic field, respectively. The generated high-frequency magnetic field is applied to the subject 102 as a pulsed high-frequency magnetic field (RF pulse) via the transmission coil 108. The NMR signal generated from the subject 102 is received by the receive coil device 200 and is detected by a receiver 114.

It should be noted that the gradient magnetic field coil 106 is configured by gradient magnetic field coils of three directions X, Y, and Z, and generates the gradient magnetic field in each direction in response to the signal from the gradient magnetic field power supply 116.

A nuclear magnetic resonance frequency (detection reference frequency f0) used as a reference for the detection in the receiver 114 is set by the sequencer 118. The sequencer 118 controls each unit to operate at a timing and intensity programmed in advance. Among the programs, a program that particularly describes the RF pulse, the gradient magnetic field, and the timing or the intensity of the signal reception is called the pulse sequence.

Various pulse sequences depending on the purpose are known, but the detailed description thereof will be omitted here.

A controller 140 controls an operation of the MRI apparatus 100 via the sequencer 118, and receives the signal detected by the receiver 114 and performs various types of signal processing, such as image reconstruction. It should be noted that the receiver 114 quadrature phase-detects an echo signal (NMR signal) that is an analog wave based on the set detection reference frequency f0, converts the echo signal into raw data, and then transmits the raw data to the controller 140, and the raw data is also referred to as the echo signal or measurement data.

The controller 140 can be configured by using a computer. The computer applied to the controller 140 may be a personal computer or a workstation.

The controller 140 receives various instruction inputs from an operation unit 150, collectively controls the respective units of the MRI apparatus 100, and performs processing of converting the echo signal in a spatial frequency domain received via the sequencer 118 into an image in the real space by performing inverse Fourier transformation, and the like to generate an MRI image.

The operation unit 150 includes a mouse, a keyboard, and the like, and functions as a part of a graphical user interface (GUI) that receives an input from an operator by using a display operation window of a display (not illustrated).

That is, the operation unit 150 and the display function as the GUI for the operator to input the activation, the stop (temporary stop), the pulse sequence selection, the imaging conditions, the processing conditions, and the like of the MRI apparatus 100.

Receive Coil Device

Figure 3:
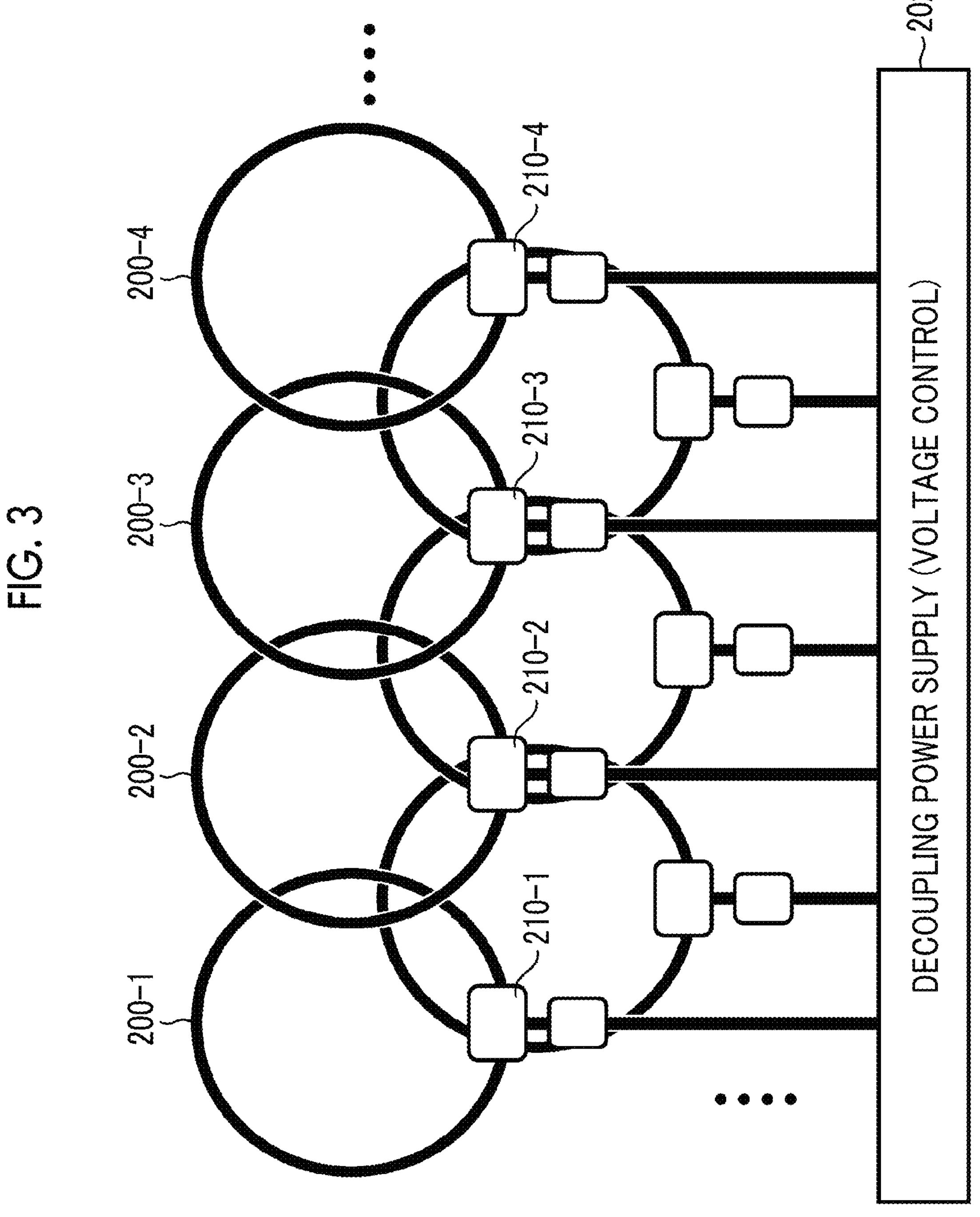
FIG. 3 is a schematic diagram illustrating a configuration of a main part of a receive coil device.

FIG. 3 is a schematic view illustrating a configuration of a main part of the receive coil device.

The receive coil device 200 of the present example is a flexible, thin, and lightweight device that can cover a wide imaging range as illustrated in FIG. 2, and it can image various examination parts.

As illustrated in FIG. 3, in the receive coil device 200, a plurality of loop-shaped coils (receive coils) 200-1, 200-2, . . . , and **200-*n* that function as antennas for receiving the nuclear magnetic resonance signal (NMR signal) are laid, and decoupling circuits 210-1, 210-2, . . . , and 210-*n* are provided corresponding to the receive coils 200-1, 200-2, . . . , and 200-*n***, respectively.

The plurality of decoupling circuits 210-1, 210-2, . . . , and **210-*n* are provided with field effect transistors (FETs) driven by a voltage, as will be described below, and the FET in each decoupling circuit is ON/OFF-controlled by a drive voltage supplied from a decoupling power supply 202**.

Decoupling Circuit

FIG. 4 is a circuit diagram illustrating an embodiment of the decoupling circuit according to the present invention.

A decoupling circuit 210 illustrated in FIG. 4 is one of the plurality of decoupling circuits 210-1, 210-2, . . . , and **210-*n* illustrated in FIG. 3**.

In FIG. 4, capacitors C1, C2, and C3 are connected in series between two terminals PD1 and PD2, and a loop-shaped coil (receive coil illustrated in FIG. 3) functioning as an antenna (not illustrated) is connected to the other end side.

The receive coil is a portion that is adjusted to resonate at a specific frequency and receives a nuclear magnetic resonance signal (NMR signal) from the subject. The specific frequency is determined by the atomic nucleus (usually, a hydrogen atomic nucleus) to be observed in a biological tissue, and the magnetic field intensity.

The transmission coil 108 illustrated in FIG. 2 applies the RF pulse to the subject 102 to generate the NMR signal in the atomic nucleus of the atom constituting the biological tissue of the subject 102, but in a case in which the receive coil is brought into the resonance state during a period in which the RF pulse is applied, there is a risk that the receive coil having a high sensitivity receives an excessive RF magnetic field, and a peripheral circuit related to the receive coil is damaged.

The decoupling circuit 210 is a circuit for sufficiently decoupling (detuning) the receive coil during at least a period in which the RF pulse is transmitted from the transmission coil 108, switching the receive coil to the detuning state (non-resonance state), and switching the receive coil to the resonance state in a case of receiving the NMR signal generated from the biological tissue of the subject 102 after the transmission of the RF pulse.

In the decoupling circuit 210 illustrated in FIG. 4, a first circuit 211 including a capacitor C4, a diode D1, a capacitor C5, and an inductor L1, and a second circuit 212 including a capacitor C6, a first field effect transistor (FET 1), a second field effect transistor (FET 2), and a capacitor C7 are connected parallel to the capacitor C2 of the receive coil.

The decoupling circuit 210 switches the receive coil to the detuning state or the resonance state by performing the ON/OFF control of the FET 1 and the FET 2.

That is, in a case in which the FET 1 and the FET 2 are turned on, the second circuit 212 including the capacitors C6 and C7 is closed, and the second circuit 212 is connected parallel to the diode D1 of the first circuit 211. As a result, the receive coils including the first circuit 211 and the second circuit 212 are sufficiently detuned relative to the frequency of the RF pulse.

On the other hand, in a case in which the FET 1 and the FET 2 are turned OFF, the second circuit 212 including the capacitors C6 and C7 is opened, and only the first circuit 211 is connected parallel to the capacitor C2 of the receive coil. As a result, the receive coil including the second circuit 212 is switched to the resonance state, and it can receive the NMR signal generated from the biological tissue.

It should be noted that the NMR signal received by the receive coil switched to the resonance state is acquired from terminals PD3 and PD4 at both ends of the capacitor C1 via a preamplifier (not illustrated).

ON/OFF Control of FET for Opening and Closing Second Circuit

Next, the ON/OFF control of the FET 1 and the FET 2 that open and close the second circuit 212 will be described.

In FIG. 4, an FET switch controller 242 that functions as a controller of the FET 1 and the FET 2 outputs a drive voltage (voltage signal T-ON) for performing the ON/OFF control of the FET 1 and the FET 2 from a logical NOT circuit (NOT circuit) 243 in synchronization with the command (command to generate the RF pulse from the transmission coil 108) transmitted from the sequencer 118 illustrated in FIG. 2 to the high-frequency magnetic field generator 112.

The voltage signal T-ON in a case in which the FET 1 and the FET 2 are turned ON is an H level signal (for example, 5 V), and the voltage signal T-ON in a case in which the FET 1 and the FET 2 are turned OFF is an L level signal (for example, 0 V). In addition, the voltage signal T-ON is output as the H level signal during a generation period of the RF pulse, and it is output as the L level signal during a period other than the generation period of the RF pulse. It should be noted that, in the present example, the H level signal and the L level signal of the voltage signal T-ON are also referred to as "1" and "0", respectively.

The voltage signal T-ON output from the FET switch controller 242 is applied to gates (G) of the FET 1 and the FET 2 via an inductor L2 and a resistor R1. Sources(S) of the FET 1 and the FET 2 are connected to each other and are connected to a ground via an inductor L3, a resistor R3, and an inductor L4. In addition, a resistor R2 is disposed between the resistor R1 and the gates (G) of the FET 1 and the FET 2. It should be noted that the resistors R1 and R2 have a sufficiently large resistor value as compared with the resistor R3, and reduce a current flowing to the ground.

In the present example, in a case in which the voltage signal T-ON is at the H level, a gate voltage higher than a threshold voltage is applied to the gates (G) of the FET 1 and the FET 2 between the gate (G) and the source(S), and a portion between the drain (D) and the source(S) is turned ON (FET 1 and FET 2 are turned ON). In addition, in a case in which the voltage signal T-ON is at the L level, the gate voltage applied to the gates (G) of the FET 1 and the FET 2 is 0 V, and a portion between the drain (D) and the source(S) is turned OFF (FET 1 and FET 2 are turned OFF).

In addition, in the present example, a Zener diode ZD is provided between the gate (G) sides of the FET 1 and the FET 2 and the ground, and an abnormal voltage is prevented from being applied to the gates (G) of the FET 1 and the FET 2. That is, the abnormal voltage exceeding a Zener voltage of the Zener diode ZD is not applied to the gates (G) of the FET 1 and the FET 2.

As described above, since the decoupling circuit 210 is configured to perform the ON/OFF control of the FET 1 and the FET 2 by using the voltage signal T-ON, for example, it is possible to reduce power consumption of the drive control of the decoupling circuits 210-1 to **210-*n*** for each receive coil of the multi-channels, as compared with a decoupling circuit using a PIN diode driven by the current.

Error Detection of Decoupling Circuit

Next, error detection of the decoupling circuit 210 will be described.

In FIG. 4, reference numerals 220A and 220 denote circuit diagrams illustrating examples of an error detection circuit (first detection circuit and second detection circuit) for detecting a failure (error) such as disconnection or short-circuit related to the FET 1 and the FET 2, respectively.

The first detection circuit 220A is a circuit for causing the current to flow from a reference voltage source to the FET 1, and an inductor L5, a resistor R4, a resistor R5 for current detection, and an inductor L6 are connected in series to each other, a reference voltage Vref is applied from the reference voltage source to one end of the circuit, and the other end of the circuit is connected to the drain (D) of the FET 1. The reference voltage Vref can be set to, for example, 15 V.

In a case in which the FET 1 is in the ON state, a current $I_1$ flows from the reference voltage source to the first detection circuit 220A, but the resistor R4 has a sufficiently large resistor value as compared with the resistor value of the resistor R5 for current detection and a direct current resistor of the inductor L6, and a current value of the current $I_1$ is a small value. That is, the reduction in the consumption of the power required for the error detection is achieved.

The second detection circuit 220B is a circuit for causing the current to flow from the reference voltage source to the FET 2, and an inductor L7, a resistor R6, a resistor for current detection R7, and an inductor L8 are connected in series to each other, the reference voltage Vref is applied from the reference voltage source to one end of the circuit, and the other end of the circuit is connected to the drain (D) of the FET 2.

The second detection circuit 220B has the same circuit configuration as the first detection circuit 220A, and a current $I_2$ flows from the reference voltage source to the second detection circuit 220B in a case in which the FET 2 is in the ON state.

In a case in which the FET 1 and the FET 2 are in the ON state, the current values of the currents $I_1$ and $I_2$ flowing to the first detection circuit 220A and the second detection circuit 220B can be reduced to achieve the reduction in the consumption of the power required for the error detection of the FET 1 and the FET 2.

The first detection circuit 220A is provided with a terminal for acquiring voltages $V_{1+}$ and $V_{1-}$ of both ends of the resistor R5, and similarly, the second detection circuit 220B is provided with a terminal for acquiring voltages $V_{2+}$ and $V_{2-}$ of both ends of the resistor R7.

Detection Unit and Determination Unit

Next, a detection unit that detects whether the current has flowed to the FET 1 and the FET 2 from the first detection circuit 220A and the second detection circuit 220B illustrated in FIG. 4, and a determination unit that determines normality or abnormality of the FET 1 and the FET 2 from a detection result of the detection unit or the like will be described.

FIG. 5 is a diagram illustrating an embodiment of the detection unit and the determination unit (error determination circuit) provided for each decoupling circuit.

In FIG. 5, the first detection unit 226 is a detection unit that detects whether the current $I_1$ has flowed from the first detection circuit 220A to the FET 1, and the second detection unit 227 is a detection unit that detects whether the current $I_2$ has flowed from the second detection circuit 220B to the FET 2.

The first detection unit 226 is formed by a differential amplifier 221 and a comparator 223.

The voltages $V_{1+}$ and $V_{1-}$ at both ends of the resistor R5 of the first detection circuit 220A are applied to the positive input and the negative input of the differential amplifier 221, respectively, and the differential amplifier 221 amplifies a difference between these voltages $V_{1+}$ and $V_{1-}$ and outputs the difference to the positive input of the comparator 223. Here, in a case in which the current $I_1$ flows from the first detection circuit 220A to the FET 1, a potential difference ($I_1 \times R$) according to the current $I_1$ and a resistor value R of the resistor R5 is generated between the voltages $V_{1+}$ and $V_{1-}$, and a detection voltage according to the potential difference is output from the differential amplifier 221 to the positive input of the comparator 223.

A threshold voltage $V_{th}$ for determining whether the current $I_1$ has flowed from the first detection circuit 220A to the FET 1 is applied to the negative input of the comparator 223, and the comparator 223 outputs a detection signal B (H level signal ("1")) indicating that the current $I_1$ has flowed in a case in which the detection voltage exceeds the threshold voltage $V_{th}$. On the other hand, in a case in which the detection voltage is equal to or lower than the threshold voltage $V_{th}$, the comparator 223 outputs the detection signal B (L level signal ("0")) indicating that the current $I_1$ does not flow. That is, the comparator 223 outputs the detection signal B indicating whether the current $I_1$ has flowed to the first detection circuit 220A.

Similarly, the second detection unit 227 is formed by a differential amplifier 222 and a comparator 224. It should be noted that the actions of the differential amplifier 222 and the comparator 224 of the second detection unit 227 are common to the differential amplifier 221 and the comparator 223 of the first detection unit 226, and thus the detailed description thereof will be omitted.

The comparator 224 of the second detection unit 227 outputs a detection signal C indicating whether the current $I_2$ has flowed to the second detection circuit 220B.

An error determination circuit 225 is formed by two exclusive OR circuits (XOR circuits) 225A and 225B and a logical sum circuit (OR circuit) 225C.

A T-ON signal A from the NOT circuit 245 is applied to the input of one of the XOR circuit 225A or the XOR circuit 225B. The NOT circuit 245 is provided in the FET switch controller 242 illustrated in FIG. 4 and is provided parallel with the NOT circuit 243 that outputs the voltage signal T-ON for performing the ON/OFF control of the FET 1 and the FET 2.

The T-ON signal A output from the NOT circuit 245 to the error determination circuit 225 is the same signal as the voltage signal T-ON output from the NOT circuit 243, and is a signal switched to the H level signal or the L level signal at the same timing. It should be noted that the reason why the NOT circuit 245 is provided separately from the NOT circuit 243 is to prevent the T-ON signal A output from the NOT circuit 245 from being affected by the decoupling circuit 210.

The detection signal B of the current $I_1$ is applied to the other input of the XOR circuit 225A from the comparator 223, and the XOR circuit 225A outputs a determination result of the H level or the L level based on the T-ON signal A and the detection signal B. Here, the XOR circuit 225A outputs the determination result of L level ("0") in a case in which the FET 1 of the decoupling circuit 210 is normal, and outputs the determination result of H level ("1") in a case in which the abnormality such as disconnection or short-circuit has occurred in the FET 1.

Similarly, the detection signal C of the current $I_2$ is applied to the other input of the XOR circuit 225B from the comparator 224, and the XOR circuit 225B outputs a determination result of the H level or the L level based on the T-ON signal A and the detection signal C. Here, the XOR circuit 225B outputs the determination result of L level ("0") in a case in which the FET 2 of the decoupling circuit 210 is normal, and outputs the determination result of H level ("1") in a case in which the abnormality has occurred in the FET 2.

The OR circuit 225C takes an OR condition of the determination results of the two XOR circuits 225A and 225B, and outputs an error detection signal D indicating whether the decoupling circuit 210 is normal or abnormal. It should be noted that the error detection signal D output from the OR circuit 225C is at the L level ("0") in a case in which the decoupling circuit 210 is normal, and is at the H level ("1") in a case in which the decoupling circuit 210 is abnormal.

FIG. 6 is a truth value table illustrating a relationship among the T-ON signal A corresponding to the FET control signal input to the error determination circuit 225, the detection signal B of the current $I_1$, the detection signal C of the current $I_2$, and the error detection signal D output from the error determination circuit 225.

As illustrated in FIG. 6, the decoupling circuit 210 (FET 1 and FET 2) is normal in a case in which the error detection signal D is "0", and the abnormality has occurred in the decoupling circuit 210 (at least one of FET 1 or FET 2) in a case in which the error detection signal D is "1".

(A) to (D) of FIG. 7 are timing charts illustrating the T-ON signal A, the detection signals B and C, and the error detection signal D illustrated in FIG. 5, respectively.

The example illustrated in FIG. 7 illustrates each signal in a case in which the decoupling circuit 210 (FET 1 and FET 2) is normal.

However, in a case in which there is a time lag between a timing of switching between the L level and the H level of the T-ON signal A that is synchronized with the ON/OFF control of the FET 1 and the FET 2 illustrated in (A) of FIG. 7 and a timing of the change between the L level and the H level of the detection signals B and C output from the comparators 223 and 224, the error detection signal D is at the H level indicating that the abnormality has occurred in the decoupling circuit 210 during the time lag.

Therefore, it is preferable that, in a case in which the voltage signal T-ON is changed to switch the FET 1 and the FET 2 from the OFF state to the ON state and to switch the FET 1 and the FET 2 from the ON state to the OFF state, the determination of normality or abnormality of the FET 1 and the FET 2 is stopped for a certain period of time from at least the change time point of the voltage signal T-ON. That is, it is preferable that, in the period of the time lag between the timing of the switching of the T-ON signal A synchronized with the voltage signal T-ON and the timing of the change in the detection signals B and C, the error detection signal D output from the error determination circuit 225 is masked (is not adopted).

Error Determination Result Transmission/Reception Unit

Next, a transmission/reception unit for the error determination result detected by the determination unit (determination unit including first detection unit 226, second detection unit 227, and error determination circuit 225) provided for each of the decoupling circuits illustrated in FIG. 5 will be described.

First Embodiment of Transmission/Reception Unit for Error Determination Result

FIG. 8 is a block diagram illustrating a first embodiment of the transmission/reception unit for the error determination result.

As illustrated in FIG. 8, a plurality of receive coils 200-1, 200-2, . . . , and **200-*n* that function as the antennas are respectively provided with the corresponding decoupling circuits 210-1, 210-2, . . . , and 210-*n*, and further, determination units 231-1, 231-2, . . . , and 231-*n*, each including the first detection unit 226, the second detection unit 227, and the error determination circuit 225 illustrated in FIG. 5, are provided corresponding to the decoupling circuits 210-1, 210-2, . . . , and 210-*n***.

The determination units 231-1, 231-2, . . . , and **231-*n* acquire the determination results (error detection signal D) of the decoupling circuits 210-1, 210-2, . . . , and 210-*n* (FET 1 and FET 2**), respectively, and each function as a transmission unit that transmits the determination result.

In FIG. 8, a detuning function controller 240 comprises the FET switch controller 242 and a determination reception unit 244.

As described above, the FET switch controller 242 outputs the voltage signal T-ON for performing the ON/OFF control of the FET 1 and the FET 2 to the decoupling circuits 210-1, 210-2, . . . , and **210-*n* in response to the command of the sequencer 118, and outputs the T-ON signal A synchronized with the ON/OFF control of the FET 1 and the FET 2 to the determination units 231-1, 231-2, . . . , and 231-*n***.

The determination reception unit 244 is connected parallel to the plurality of determination units 231-1, 231-2, . . . , and **231-*n* in a one-to-many manner, and functions as a reception unit that receives the determination results transmitted from the respective determination units 231-1, 231-2, . . . , and 231-*n***.

The determination reception unit 244 adds a unique address (unique address assigned to each determination unit) for each determination unit to a plurality of determination results in accordance with a certain rule, and returns the plurality of determination results added with the unique addresses to the sequencer 118.

In a case in which the sequencer 118 or the controller 140 (see FIG. 2) of the sequencer 118 receives the determination result indicating that the FET 1 and/or the FET 2 is abnormal, the sequencer 118 or the controller 140 can detect which of the decoupling circuits among the plurality of decoupling circuits 210-1, 210-2, . . . , and **210-*n*** the abnormality has occurred in, based on the address added to the determination result.

In addition, the determination reception unit 244 is not limited to a case in which the address is added to the detection result, and each of the determination units 231-1, 231-2, . . . , and **231-*n*** may transmit its own determination result and the address allocated to itself in association with each other (by adding the address allocated to itself to its own determination result) in a case of transmitting its own determination result.

It should be noted that the transmission of the determination result or the like is not limited to a case of being electrically transmitted using an electric signal cable, and may be optically transmitted using an optical signal cable, or may be transmitted using wireless or other communication units.

Second Embodiment of Transmission/Reception Unit for Error Determination Result

FIG. 9 is a block diagram illustrating a second embodiment of the transmission/reception unit for the error determination result. It should be noted that, in the transmission/reception unit according to the second embodiment illustrated in FIG. 9, the same reference numerals are added to the portions common to the transmission/reception unit according to the first embodiment illustrated in FIG. 8, and the detailed description thereof will be omitted.

The transmission/reception unit according to the second embodiment illustrated in FIG. 9 is different from the transmission/reception unit according to the first embodiment in the communication method of the error determination result.

That is, the plurality of determination units 232-1, 232-2, . . . , and **232-*n* provided corresponding to the plurality of decoupling circuits 210-1, 210-2, . . . , and 210-*n***, respectively, are connected in series to each other.

Here, the plurality of determination units 232-1, 232-2, . . . , and **232-*n* are defined as the first to n-th determination units, the first determination unit 232-1 is connected to the determination reception unit 244, and the determination unit 232-*n*** that is lastly connected in series is defined as the n-th determination unit.

The n-th determination unit **232-*n* transmits its own determination result to the (n−1)-th determination unit 232-(*n*−1), the (n−1)-th determination unit 232-(*n*−1) concatenates the received determination result of the n-th determination unit 232-*n* with its own determination result, and transmits the concatenated determination result to the (n−2)-th determination unit 232-(*n*−2), this process is repeated, and as a result, the first determination unit 232-1 transmits the determination result (transmission data) in which the determination results of the plurality of determination units 232-1, 232-2, . . . , 232-(*n*−1), . . . , and 232-*n* are sequentially concatenated to the determination reception unit 244**.

With the transmission/reception unit for the error determination result according to the second embodiment, the number of signal cables can be reduced as compared with the first embodiment.

In addition, it is preferable that each of the determination units 232-1, 232-2, . . . , **232-(*n*−1), . . . , and 232-*n*** also concatenates the determination result along with its own address in a case of concatenating its own determination results.

FIG. 10 is a diagram illustrating an example of the transmission data such as the determination result transmitted from each determination unit illustrated in FIG. 9.

As illustrated in FIG. 10, the n-th determination unit 232-*n* transmits the transmission data of its own address n+the determination result (0) to the (n−1)-th determination unit 232-(*n*−1). It should be noted that, in FIG. 10, the determination result in the transmission data is 1-bit data that is "0" in a case of normal and is "1" in a case of the abnormality (error).

The (n−1)-th determination unit 232-(*n*−1) transmits the transmission data in which its own address (n−1)+the determination result (0) is concatenated to the address n+the determination result (0) received from the n-th determination unit 232-*n* to the (n−2)-th determination unit 232-(*n*−2).

By repeating the above-described process via the respective determination units in order, the first determination unit 231-1 can transmit the transmission data indicating the determination results added with the addresses of all the determination units 232-1, 232-2, . . . , 232-(*n*−1), . . . , and 232-*n* to the determination reception unit 244.

Third Embodiment of Transmission/Reception Unit for Error Determination Result

FIG. 11 is a block diagram illustrating a third embodiment of the transmission/reception unit for the error determination result. It should be noted that, in the transmission/reception unit according to the third embodiment illustrated in FIG. 11, the same reference numerals are added to the portions common to the transmission/reception unit according to the second embodiment illustrated in FIG. 9, and the detailed description thereof will be omitted.

The transmission/reception unit according to the third embodiment illustrated in FIG. 11 is different from the transmission/reception unit according to the second embodiment in that a plurality of detection units (switch units) are provided in each decoupling circuit, and an independent determination unit is provided for each detection unit.

That is, the receive coil 200-1 is provided with a plurality of (two) switch units 210-1*a* and 210-1*b* of the decoupling circuit, and is provided with determination units 233-1*a* and 233-1*b* that individually determine normality or abnormality of each of the switch units 210-1*a* and 210-1*b*. Similarly, the two switch units and the determination unit are provided in each of the other receive coils 200-2 to 200-*n*.

As illustrated in FIG. 11, all the determination units 233-1*a*, 233-1*b*, 233-2*a*, 233-2*b*, . . . , 233-*na*, and 233-*nb* are connected to the determination unit 233-*a*, and the determination unit 233-*a* transmits the transmission data in which the determination results of all the determination units 233-1*a*, 233-1*b*, 233-2*a*, 233-2*b*, . . . , 233-*na*, and 233-*nb* are concatenated with each other, to the determination reception unit 244.

FIG. 12 is a diagram illustrating an example of the transmission data of the determination result transmitted from the determination unit connected to the determination reception unit to the determination reception unit.

As illustrated in FIG. 12, the determination unit 233-1*a* connected to the determination reception unit 244 transmits the transmission data in which all the determination results added with the addresses of the determination units 233-1*a*, 233-1*b*, 233-2*a*, 233-2*b*, . . . , 233-*na*, and 233-*nb* are concatenated with each other, to the determination reception unit 244.

According to the third embodiment, the number of signal cables used for transmitting the transmission data can be reduced as in the second embodiment, and in a case in which a plurality of switch units are provided in one receive coil, the determination result of normality or abnormality can be transmitted to the determination reception unit 244 for each of the switch units.

OTHERS

In the present embodiment, the two FETs 1 and 2 are provided in one decoupling circuit, but one FET may be used.

In addition, the resistor R3 of a circuit unit 220C between the sources(S) of the FET 1 and the FET 2 and the ground, which is illustrated by the broken line in FIG. 4, may be used as a resistor for current detection for detecting a current $I_{SHUNT}$ flowing from the sources (S) of the FET 1 and the FET 2 to the ground. That is, the current $I_{SHUNT}$ may be detected based on the voltages $V_{0+}$ and $V_{0-}$ at both ends of the resistor R3, and thus the normality or abnormality of the FET 1 and the FET 2 may be detected.

It should be noted that the current $I_{SHUNT}$ includes the current flowing to the resistor R2, but the resistor R2 has a sufficiently large resistor value as compared with the resistor R3 to the extent that the current can be ignored. The circuit unit 220C illustrated by the broken line may be omitted in a case in which it is not determined normality or abnormality of the FET 1 and the FET 2 by using the current $I_{SHUNT}$.

It is needless to say that the present invention is not limited to the above-described embodiments, and various modifications can be made without departing from the gist of the present invention.

EXPLANATION OF REFERENCES

100: MRI apparatus
102: subject
108: transmission coil
110: gantry
120: bore
130: examination table
200: receive coil device
210, 210-1 to 210-*n*: decoupling circuit
220A: first detection circuit
220B: second detection circuit

What is claimed is:

1. A magnetic resonance imaging apparatus comprising:
a plurality of receive coils that have a plurality of coils, that are adjusted to resonate at a specific frequency, and that receive a nuclear magnetic resonance signal from a subject;
a plurality of decoupling circuits that are respectively connected to the plurality of receive coils and that each include a field effect transistor, the plurality of decoupling circuits switching each of the receive coils between a resonance state and a detuning state according to a drive voltage applied to a gate of the field effect transistor;
a controller that controls the drive voltage applied to the gate of the field effect transistor of each of the plurality of decoupling circuits;
a detection unit that includes a detection circuit for causing a current to flow from a reference voltage source to the field effect transistor and that detects whether the current has flowed to the field effect transistor via the detection circuit; and
a determination unit that determines normality or abnormality of the field effect transistor based on a state of the drive voltage applied to the gate of the field effect transistor and a detection result of the detection unit.

2. The magnetic resonance imaging apparatus according to claim 1, wherein the detection circuit includes a resistor for current detection, and the detection unit detects whether the current has flowed to the field effect transistor based on a potential difference between both ends of the resistor.

3. The magnetic resonance imaging apparatus according to claim 2, wherein the detection circuit includes an inductor.

4. The magnetic resonance imaging apparatus according to claim 1, wherein one end of the detection circuit is connected to the reference voltage source, and the other end of the detection circuit is connected to a drain of the field effect transistor.

5. The magnetic resonance imaging apparatus according to claim 1, wherein the detection circuit is provided between a source of the field effect transistor and a ground.

6. The magnetic resonance imaging apparatus according to claim 1, wherein the field effect transistor of the decoupling circuit consists of a first field effect transistor and a second field effect transistor each having a source connected, and the detection unit consists of a first detection unit that includes a first detection circuit for causing the current to flow from the reference voltage source to the first field effect transistor and that detects whether the current has flowed to the first field effect transistor via the first detection circuit, and a second detection unit that includes a second detection circuit for causing the current to flow from the reference voltage source to the second field effect transistor and that detects whether the current has flowed to the second field effect transistor via the second detection circuit.

7. The magnetic resonance imaging apparatus according to claim 6, wherein the determination unit determines normality or abnormality of at least one of the first field effect transistor or the second field effect transistor based on a state of the drive voltage applied to a gate of the first field effect transistor and a gate of the second field effect transistor, a detection result of the first detection unit, and a detection result of the second detection unit.

8. The magnetic resonance imaging apparatus according to claim 1, wherein, in a case in which the drive voltage is changed to switch the field effect transistor from an OFF state to an ON state and to switch the field effect transistor from the ON state to the OFF state, the determination unit stops the determination of the normality or the abnormality of the field effect transistor for a certain period from at least a change time point of the drive voltage.

9. The magnetic resonance imaging apparatus according to claim 1, wherein a Zener diode is provided on a gate side of the field effect transistor, to prevent an abnormal voltage from being applied to the gate of the field effect transistor.

10. The magnetic resonance imaging apparatus according to claim 1, further comprising:

a determination reception unit that receives a determination result of the determination unit provided corresponding to each of the plurality of decoupling circuits, wherein the determination reception unit is connected parallel to a plurality of the determination units and acquires the determination result from each of the plurality of determination units.

11. The magnetic resonance imaging apparatus according to claim 10, wherein the determination reception unit adds a unique address for each determination unit to each of a plurality of the received determination results.

12. The magnetic resonance imaging apparatus according to claim 10, wherein each of the plurality of determination units has a unique address for each determination unit, and transmits the determination result and the address to the determination reception unit in association with each other.

13. The magnetic resonance imaging apparatus according to claim 1, further comprising:

a determination reception unit that receives the determination results from a plurality of the determination units provided corresponding to the plurality of decoupling circuits, respectively, wherein the plurality of determination units are connected in series to each other, and in a case in which the plurality of determination units are denoted by 1 to n and a lastly connected determination unit is defined as an n-th determination unit, the n-th determination unit transmits its own determination result to an (n−1)-th determination unit, the (n−1)-th determination unit concatenates the received determination result of the n-th determination unit with its own determination result and transmits the concatenated determination result to an (n−2)-th determination unit, this process is repeated, and as a result, a first determination unit transmits the determination result in which the determination results of the plurality of determination units are sequentially concatenated to the determination reception unit.

14. The magnetic resonance imaging apparatus according to claim 13, wherein each of the plurality of determination units has a unique address for each determination unit, and concatenates the determination result along with its own address in a case of concatenating the determination result.

* * * * *